US010266402B2

(12) United States Patent
Yaglioglu et al.

(10) Patent No.: US 10,266,402 B2
(45) Date of Patent: Apr. 23, 2019

(54) CONTACTOR DEVICES WITH CARBON NANOTUBE PROBES EMBEDDED IN A FLEXIBLE FILM AND PROCESSES OF MAKING SUCH

(71) Applicant: FormFactor, Inc., Livermore, CA (US)

(72) Inventors: Onnik Yaglioglu, Livermore, CA (US); Benjamin N. Eldridge, Livermore, CA (US); Alexander Slocum, Bow, NH (US)

(73) Assignee: FormFactor, Inc., Livermore, CA (US)

( * ) Notice: Subject to any disclaimer, the term of this patent is extended or adjusted under 35 U.S.C. 154(b) by 1234 days.

(21) Appl. No.: 13/681,967

(22) Filed: Nov. 20, 2012

(65) Prior Publication Data

US 2014/0139250 A1    May 22, 2014

(51) Int. Cl.
*B82Y 30/00* (2011.01)
*G01R 1/067* (2006.01)
*G01Q 70/12* (2010.01)
*G01R 1/073* (2006.01)

(52) U.S. Cl.
CPC .......... *B82Y 30/00* (2013.01); *G01R 1/06744* (2013.01); *G01Q 70/12* (2013.01); *G01R 1/07314* (2013.01)

(58) Field of Classification Search
CPC .......... G01Q 70/12; G01Q 60/38; B82Y 30/00
See application file for complete search history.

(56) References Cited

U.S. PATENT DOCUMENTS

| 4,352,061 A | * | 9/1982 | Matrone | ............ | G01R 1/07371 |
| | | | | | 324/754.14 |
| 4,935,696 A | * | 6/1990 | DiPerna | ............. | G01R 1/07378 |
| | | | | | 324/72.5 |
| 5,127,837 A | * | 7/1992 | Shah | ..................... | G01R 1/0408 |
| | | | | | 439/248 |
| 5,282,111 A | * | 1/1994 | Hopfer | ................. | G01R 1/0408 |
| | | | | | 165/185 |
| 6,334,247 B1 | | 1/2002 | Beaman et al. | | |
| 7,400,159 B2 | | 7/2008 | Wang et al. | | |
| 7,439,731 B2 | | 10/2008 | Crafts et al. | | |

(Continued)

FOREIGN PATENT DOCUMENTS

KR    10-2011-0065540 A    6/2011

OTHER PUBLICATIONS

Oxford Dictionaries, Interlock Definition, Retrieved Jul. 29, 2016 using web.archive.org from snapshot taken Jul. 20, 2012, https://web.archive.org/web/20120720030011/http:/oxforddictionaries.com/definition/english/interlock.*

(Continued)

*Primary Examiner* — Huy Q Phan
*Assistant Examiner* — Dustin R Dickinson
(74) *Attorney, Agent, or Firm* — Lumen Patent Firm

(57) ABSTRACT

Electrically conductive columns of intertwined carbon nanotubes embedded in a mass of material flexible, resilient electrically insulating material can be used as electrically conductive contact probes. The columns can extend between opposing sides of the mass of material. Terminals of a wiring substrate can extend into the columns and be electrically connected to an electrical interface to a tester that controls testing of a device under test. A pair of physically interlocked structures can coupling the mass of material to the wiring substrate. The pair can include a receptacle and a protrusion.

18 Claims, 18 Drawing Sheets

(56) References Cited

U.S. PATENT DOCUMENTS

| | | | |
|---|---|---|---|
| 7,868,630 B2* | 1/2011 | Caldwell | G01R 1/07342 324/754.23 |
| 7,948,253 B2* | 5/2011 | Kimoto | G01R 1/07364 324/755.01 |
| 8,130,007 B2 | 3/2012 | Eldridge et al. | |
| 8,149,007 B2 | 4/2012 | Chen et al. | |
| 8,164,000 B2 | 4/2012 | Yeh et al. | |
| 8,272,124 B2 | 9/2012 | Fang et al. | |
| 2004/0211589 A1 | 10/2004 | Chou et al. | |
| 2005/0048697 A1* | 3/2005 | Uang | B82Y 10/00 438/108 |
| 2006/0139045 A1* | 6/2006 | Gallagher | G01R 31/2889 324/750.19 |
| 2007/0013390 A1 | 1/2007 | Kuitani et al. | |
| 2007/0126442 A1 | 6/2007 | Watanabe et al. | |
| 2009/0239338 A1* | 9/2009 | Zhou | B82Y 10/00 438/108 |
| 2010/0083489 A1 | 4/2010 | Eldridge et al. | |
| 2011/0043239 A1 | 2/2011 | Tomita et al. | |
| 2012/0086004 A1 | 4/2012 | Fang et al. | |
| 2012/0199280 A1 | 8/2012 | Brandorff | |

OTHER PUBLICATIONS

The International Search Report and the Written Opinion of the International Searching Authority, PCT Application Serial No. PCT/US2013/070572 (dated Feb. 27, 2014), 11 pages.

\* cited by examiner

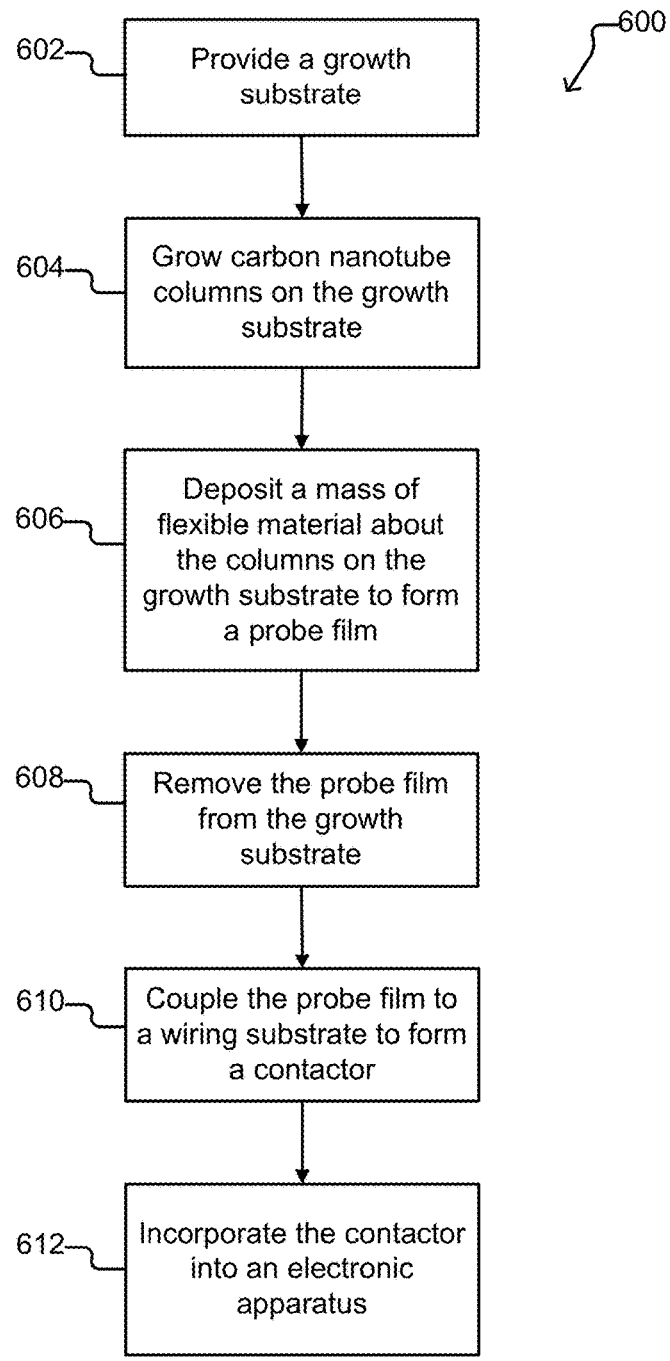

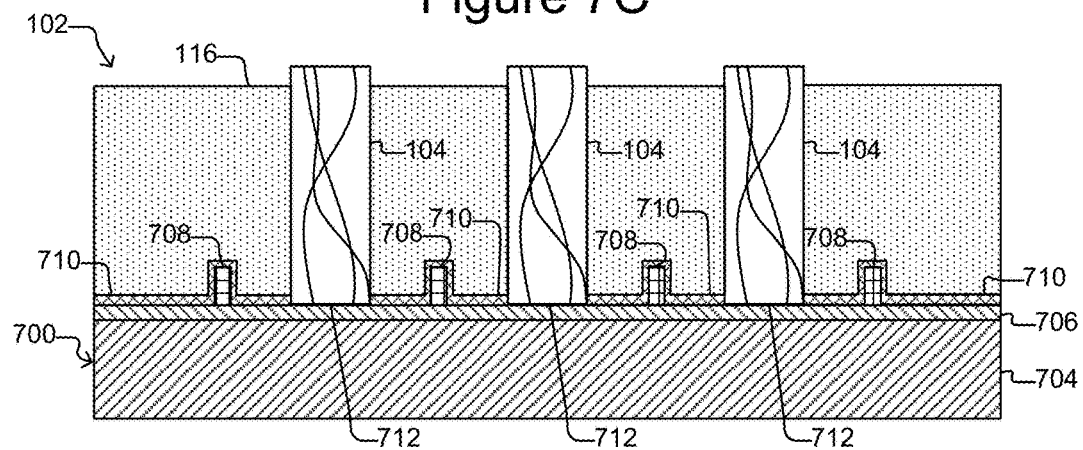
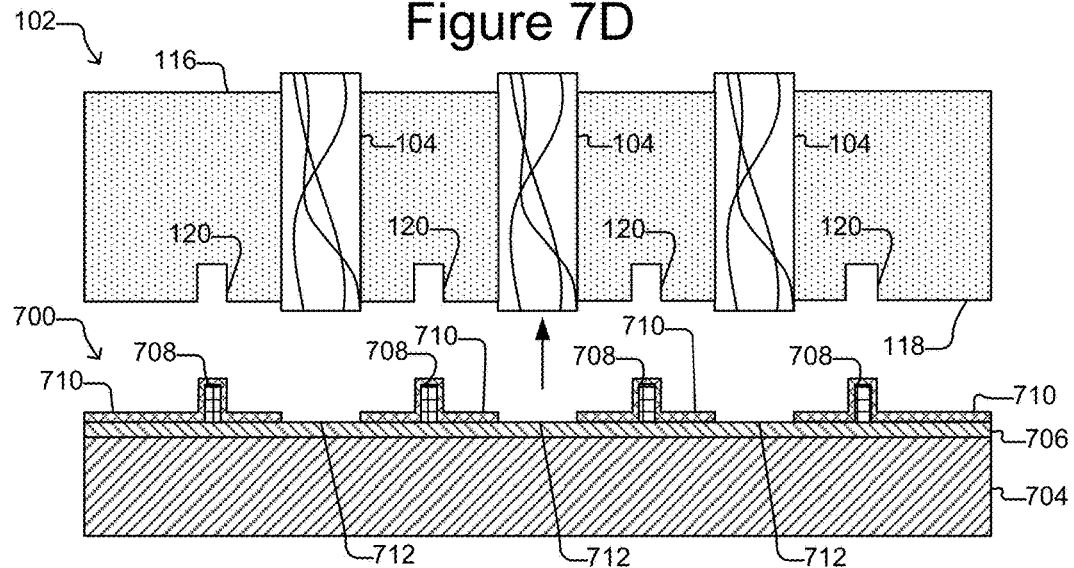

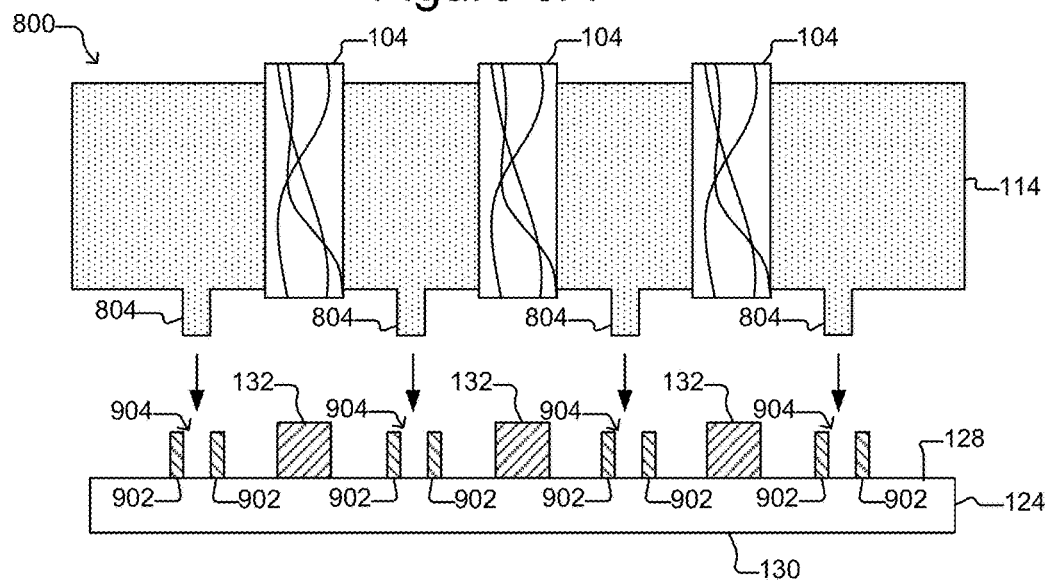
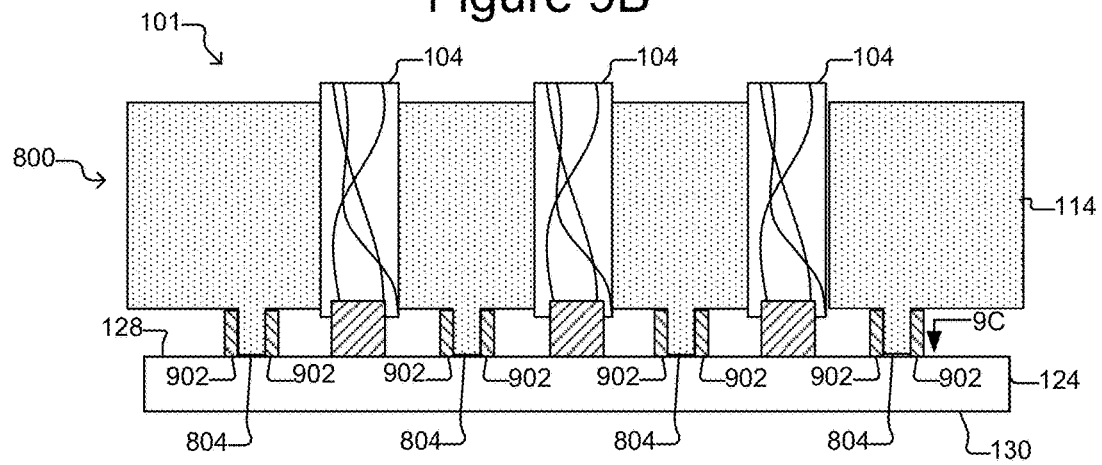

CONTACTOR DEVICES WITH CARBON NANOTUBE PROBES EMBEDDED IN A FLEXIBLE FILM AND PROCESSES OF MAKING SUCH

BACKGROUND

Carbon nanotube columns on electronic devices can make temporary, pressure based electrical connections with terminals or other such inputs and/or outputs of a second electronic device. For example, carbon nanotube columns acting as probes on an electronic device can be pressed against the terminals of the second electronic device to make temporary electrical connections between the probes and the terminals and thus between the electronic device and the second electronic device. Embodiments of the present invention are directed to carbon nanotube columns embedded in a flexible film attached to a contactor device and methods of making the flexible film and contactor device. In some embodiments of the present invention, superior dimensional accuracy and stability can be achieved.

SUMMARY

In some embodiments, a probe card assembly can include an electrical interface to a tester that controls testing of a device under test. The probe card assembly can also include a mass of flexible, resilient electrically insulating material and electrically conductive columns of intertwined carbon nanotubes embedded in the mass of material. Each of the columns can extend from a first side of the mass of material to a second (opposite) side of the mass of material. The probe card assembly can also include a wiring substrate, which can include electrically conductive terminals that extend from a first side of the wiring substrate into the columns, and the terminals can be electrically connected to the interface. Pairs of physically interlocked structures can couple the mass of material to the wiring substrate. A first one of the interlocked structures in each pair can be a receptacle, and a second one of the interlocked structures in each pair can be a protrusion inserted into and physically interlocked with the receptacle. The receptacle can be part of one of the mass of material or the wiring substrate, and the protrusion can be part of the other of the mass of material or the wiring substrate.

In some embodiments, an electronic device can include a probe film, a wiring substrate, and pairs of physically interlocked structures coupling the mass of a material to the wiring substrate. The probe film can include a mass of flexible, resilient electrically insulating material in which electrically conductive columns of intertwined carbon nanotubes are embedded. The wiring substrate can include electrically conductive terminals that extend from a first side of the wiring substrate into the columns. A first of the interlocked structures in each pair can be a receptacle, and a second of the interlocked structures in each pair can be a protrusion inserted into and physically interlocked with the receptacle.

BRIEF DESCRIPTION OF THE DRAWINGS

FIG. 6 illustrates an example of a process for making a contactor device such as a probe card assembly with a film containing probes comprising carbon nanotube columns according to some embodiments of the invention.

FIG. 7C illustrates an example of the growth substrate and carbon nanotube columns of FIG. 7B and a deposited mass of material on the growth substrate according to some embodiments of the invention.

FIG. 7D illustrates the carbon nanotube columns and mass of material (collectively a probe film) of FIG. 7C removed from the growth substrate according to some embodiments of the invention.

FIG. 9A illustrates the film of FIG. 8C after being removed from the growth substrate and a wiring substrate according to some embodiments of the invention.

FIG. 9B illustrates the film and a wiring substrate of FIG. 9A assembled according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. As used herein, "substantially" means sufficient to work for the intended purpose. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "ones" means more than one.

Figure 9C:
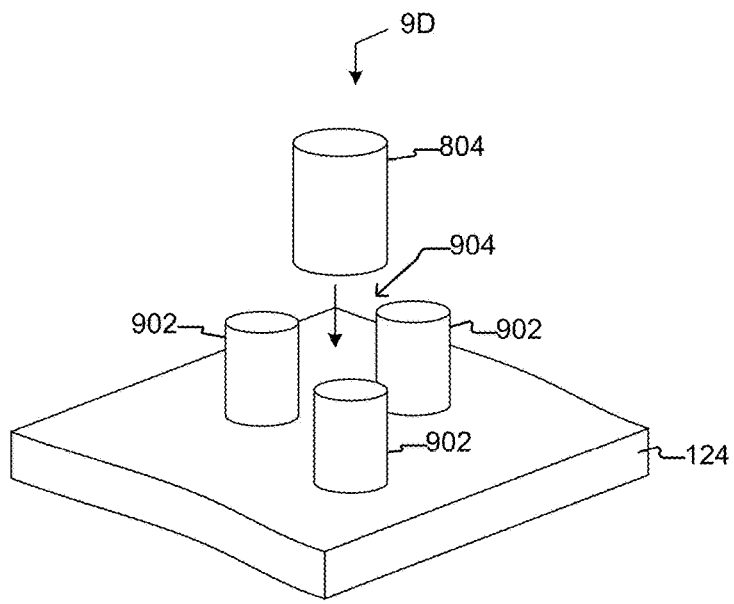
FIG. 9C illustrates a perspective partial view of a wiring substrate with a receptacle comprising posts and a corresponding protrusion according to some embodiments of the invention.
Figure 9D:
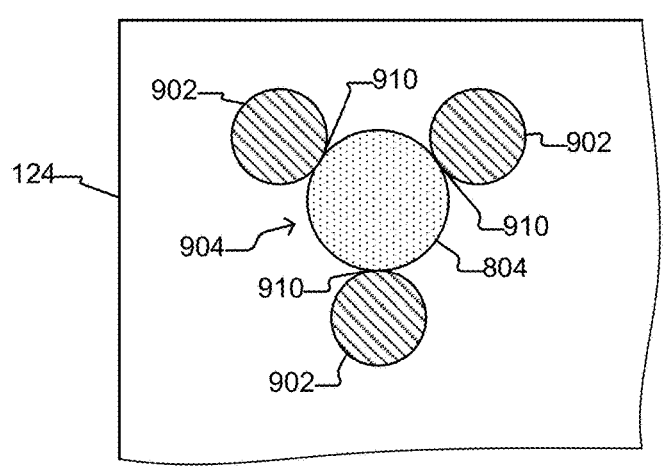
FIG. 9D illustrates a top view of view of FIG. 9C.
Figure 9E:
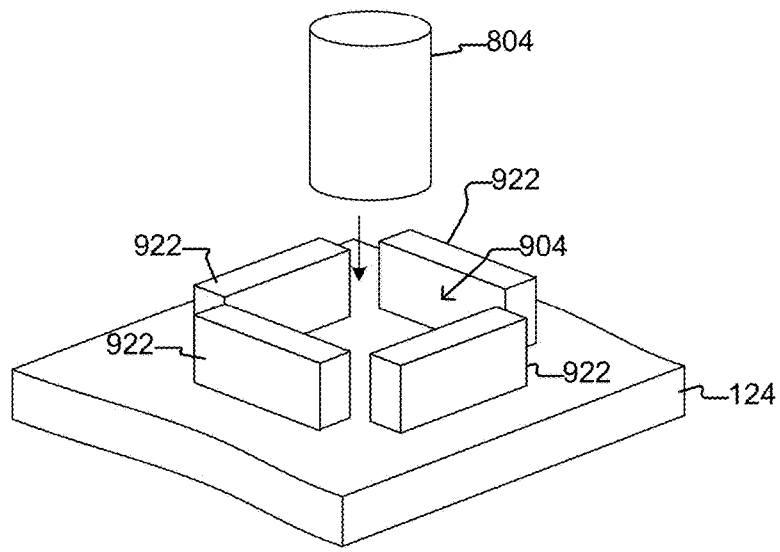
FIG. 9E illustrates a perspective partial view of a wiring substrate with a receptacle comprising walls disposed in a square or rectangular pattern and a corresponding protrusion according to some embodiments of the invention.
Figure 9F:
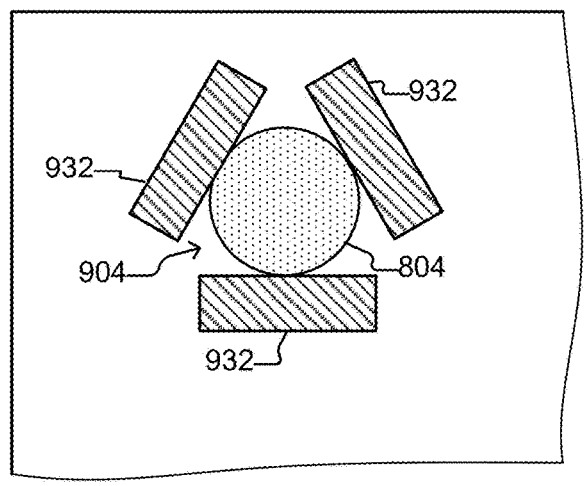
FIG. 9F illustrates a top partial view of a wiring substrate with a receptacle comprising walls disposed in a triangular pattern and a corresponding protrusion according to some embodiments of the invention.
Figure 9G:
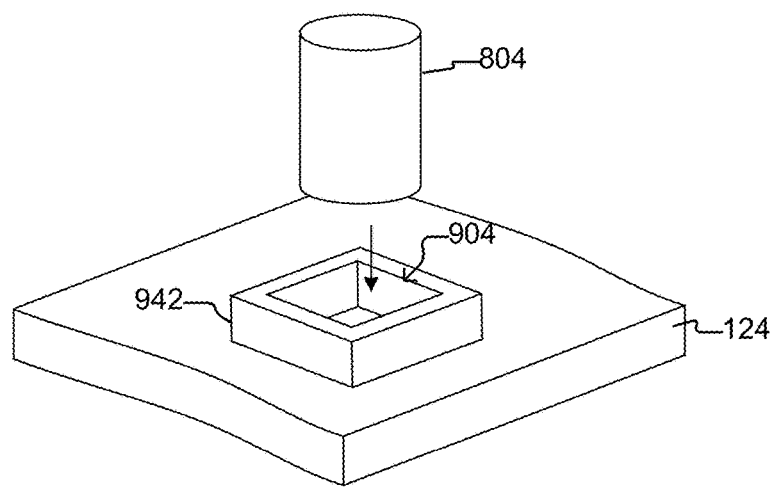
FIG. 9G illustrates a perspective partial view of a wiring substrate with a receptacle comprising a square or rectangular shaped enclosure and a corresponding protrusion according to some embodiments of the invention.
Figure 9H:
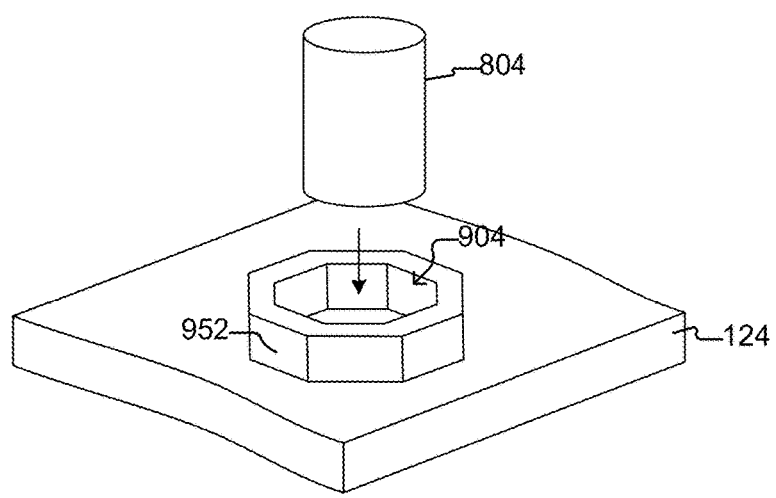
FIG. 9H illustrates a perspective partial view of a wiring substrate with a receptacle comprising a hexagon like enclosure and a corresponding protrusion according to some embodiments of the invention.

Embodiments of the invention include one or more probe films coupled by interlocking structures to a wiring substrate. Each interlocking structure can comprise a protrusion that is press fit into a receptacle. One of the protrusion or the receptacle can be on the probe film, and the other of the protrusion or the receptacle can be on the wiring substrate. As will be discussed below, the receptacles can be configured in a variety of different forms. For example, a receptacle can comprise a hole or groove like the receptacles 120 illustrated in FIGS. 1A and 1B into which a protrusion such as protrusions 134 can be press fit. As another example, a receptacle can be configured like the receptacle 904 illustrated in FIGS. 9A-9H. As illustrated in those figures, the receptacle can comprise rods 902 as shown in FIGS. 9C and 9D, walls 922 and 932 as illustrated in FIGS. 9E and 9F, or an enclosure 942 and 952 as shown in FIGS. 9G and 9H disposed to define an interior space into which a receptacle like receptacle 804 can be press fit. These and other examples are illustrated and discussed below with regard to examples of electronic devices that comprise probe films coupled to a wiring substrate. It is noted that some embodiments of the invention are capable of coupling probe films to a wiring substrate with superior dimensional accuracy and stability over prior art. Examples of such advantages are discussed below with respect to FIGS. 14A and 14B.

Figure 1A:
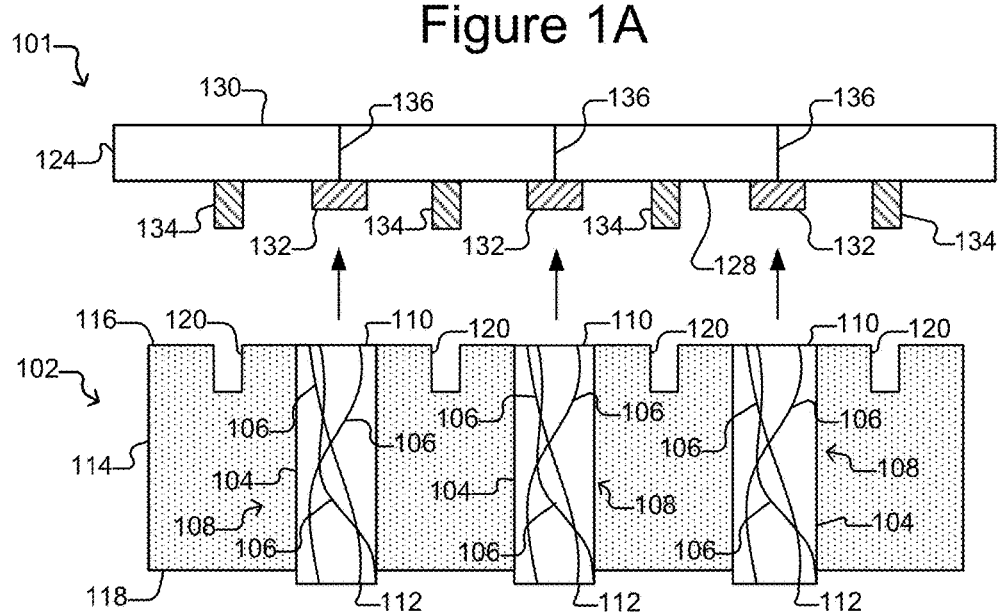
FIG. 1A illustrate an example of an unassembled contactor according to some embodiments of the invention.
Figure 1B:
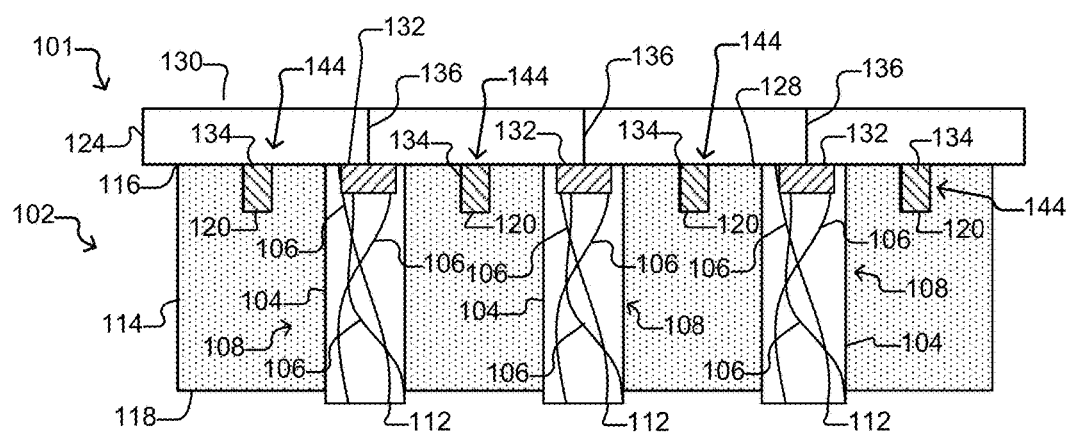
FIG. 1B illustrates the contactor of FIG. 1A assembled.

FIGS. 1A and 1B illustrate an example of an electrical contactor 101 according to some embodiments of the invention. As shown, the electrical contactor 101 can comprise one or more probe films 102 coupled to a wiring substrate 124. Although one probe film 102 is shown coupled to the wiring substrate 124, more than one such probe film 102 can be coupled to the wiring substrate 124.

Figure 2:
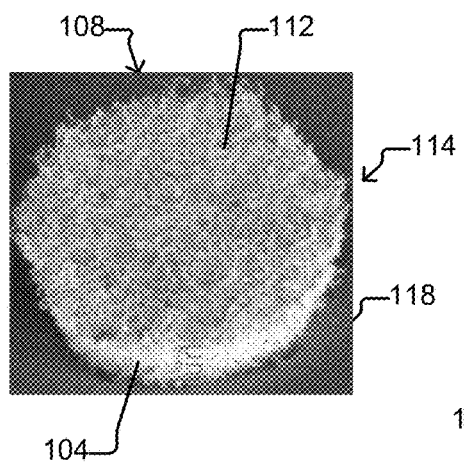
FIG. 2 shows a photograph of a carbon nanotube column embedded in a mass of flexible, resilient electrically insulating material according to some embodiments of the invention.

The probe film 102 can comprise electrically conductive probes 108 comprising electrically conductive carbon nanotube columns 104 embedded in a mass of flexible and insulating material 114. As shown, each column 104 can extend within the material 114 from a first side 116 of the material 114 to a second side 118 of the material 114. As such, a first end 110 and a second end of the column 104 can be exposed at opposing sides 116 and 118 of the material 114 as shown. FIG. 2 is a photograph showing a second end 112 of a carbon nanotube column 104 extending from a second side 118 of the material 114.

Referring again to FIGS. 1A and 1B, each carbon nanotube column 104 can comprise a group of bundled carbon nanotubes 106, which can be generally vertically aligned, although some of the carbon nanotubes 106 in the group can overlap, be comingled or intertwined, or otherwise contact one or more other carbon nanotubes 106 in one or more places. In some embodiments, not all of the carbon nanotubes 106 in a column 104 need extend the entire length of the column 104. Although three such carbon nanotubes 106 are shown in each column 104 in FIGS. 1A and 1B, each column 104 can include many more (e.g., tens, hundreds, or thousands) of individual carbon nanotubes 106.

The mass of material 114 can be flexible, resilient, elastic, and/or electrically insulating. As such, the mass of material 114 can electrically insulate the columns 104 from each other and/or provide a flexible, elastic film that supports the columns 104. During manufacture of the film 102, the mass of material 114 can infiltrate the columns 104. The mass of material 114 can thus be inside the columns 104 between individual ones of the carbon nanotubes 106 of a column 104. This can strengthen the columns 104, and physically couple the columns to the material 114, which can prevent the columns 104 from falling or being pulled out of the material 114. In some embodiments, the mass of material 114 can comprise a flexible and/or elastomeric material, such as a resilient polymer material. Suitable materials for the mass of material 114 include elastomers such as silicone-based elastomer materials (e.g., polydimethylsiloxane (PDMS)). Still other examples of suitable materials for the mass of material 114 include rubber materials and flexible plastic materials.

The wiring substrate 124 can comprise electrical terminals 132 on a first side 128 of the wiring substrate 124 and electrical connections 136 from the electrical terminals 132 to a second side 130 of the wiring substrate 124. Although shown as internal to the wiring substrate 124, the electrical connections 136 can alternatively be external or a combination of external and internal to the wiring substrate 124. For example, the electrical connections 136 can comprise electrically conductive traces (not shown) on the wiring substrate 124 each connected to one or more of the terminals 132 and electrically conductive wires (not shown) bonded from those traces (not shown) to the base 126. The wiring substrate 124 can also provide physical support for the probe film 102. Suitable examples of the wiring substrate 124 include a glass substrate, a printed circuit board, a wiring ceramic, a quartz substrate, a semiconductor wafer or die, or the like.

As shown, the probe film 102 can be physically coupled to the wiring substrate 124 such that the terminals 132 of the wiring substrate 124 can be electrically connected to the columns 104. For example, as shown in FIG. 1B, the probe film 102 can be coupled to the wiring substrate 124 such that each of the terminals 132 is pressed into, and thus entirely or partially embedded in, one of the columns 104. Each column 104 of the probe film 102 can thus be electrically connected to one of the terminals 132 of the wiring substrate 124.

As shown in FIG. 1B, the probe film 102 and the wiring substrate 124 can have interlocking features 144 that couple the probe film 102 to the wiring substrate 124. As shown in FIGS. 1A and 1B, the interlocking features 144 can comprise protrusions 134 that interlock with receptacles 120, which can couple the probe film 102 to the wiring substrate 124. For example the protrusions 134 can extend from the first side 128 of the wiring substrate 124, and corresponding receptacles 120 can extend into the first side 116 of the mass of material 114. Each protrusion 134 can physically extend into and interlock with a corresponding one of the receptacles 120, which can coupled the probe film 102 to the wiring substrate 124. Some or all of the protrusions 134 can alternatively extend form the first side 116 of the mass of material 114, and some or all of the corresponding receptacles 120 can be in the first side 128 of the wiring substrate 124.

Returning to FIGS. 1A and 1B, it is noted that although not shown, an adhesive (not shown) can be disposed between the wiring substrate 124 and the mass of material 114 and can adhere the first side 116 of the mass of material 114 to the first side 128 of the wiring substrate 124. Such an adhesive (not shown) can be used in conjunction with the interlocking features 144 to strengthen the coupling of the probe film 102 to the wiring substrate 124 or in place of the interlocking features 144. A surface treatment can, in some embodiments, be applied to the first side 116 of the mass of material 114 and/or the first side 128 of the wiring substrate 124 to enhance adhesion of the first side 116 of the mass of material 114 to the first side 128 of the wiring substrate 124. Examples of such surface treatments include oxygen plasma treatments and reactive ion etch plasma treatments.

Returning to the interlocking features 144, each protrusion 134 can interlock with a corresponding receptacle 120 by forming a friction fit (e.g., a press fit) with the receptacle 120. For example, each protrusion 134 can be approximately the same size as or slightly larger than its corresponding receptacle 120 so that each protrusion 134 forms a friction based interlocking fit when press fit into the receptacle 120.

Figure 4:
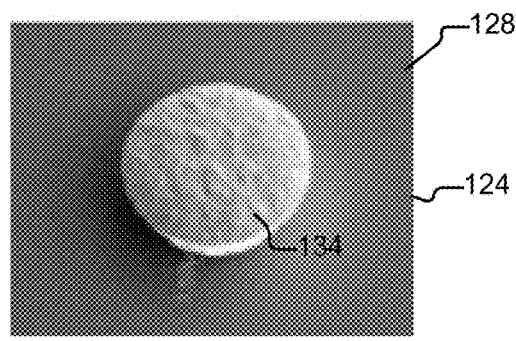
FIG. 4 shows a photograph of an example of the protrusion of FIG. 3 according to some embodiments of the invention.
Figure 5:
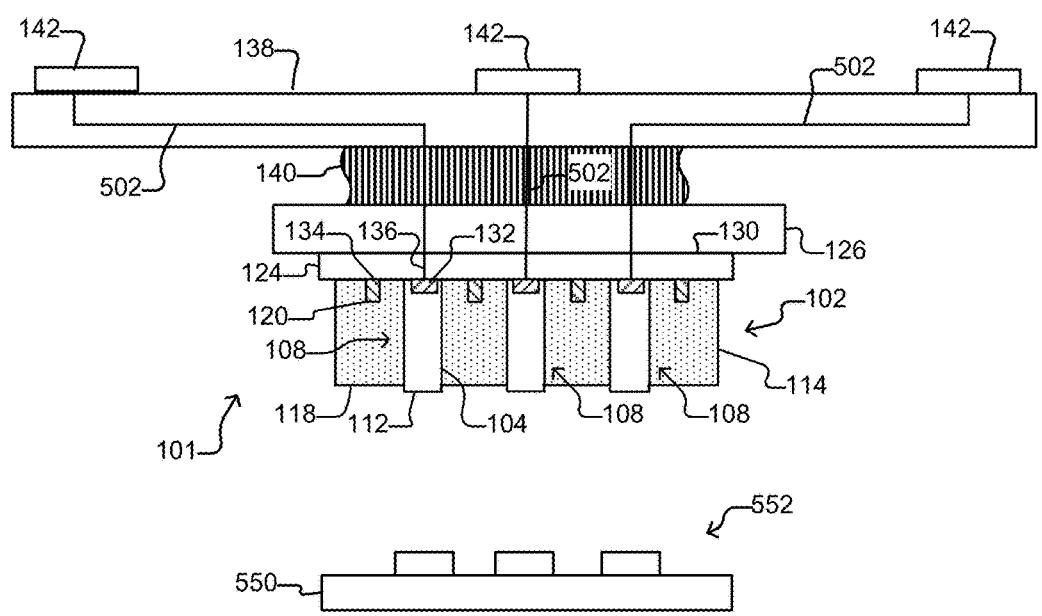
FIG. 5 illustrates an example of a probe card assembly that includes the contactor of FIGS. 1A and 1B according to some embodiments of the invention.

Although illustrated as generally rectangular in FIGS. 1A and 1B, the protrusions 134 and receptacles 120 can by other shapes such as shapes comprising a cylinder, cube, pyramid, cone, including partial versions of the foregoing of the like. Moreover, the interlocking features 144 can be shaped to achieve or enhance interlocking connections. FIGS. 4 and 5 illustrate an example. FIG. 4 shows a side cross-sectional view of an example of the protrusion 134 and a corresponding receptacle 120, and FIG. 4 is a photograph of the protrusion 134.

Figure 3:
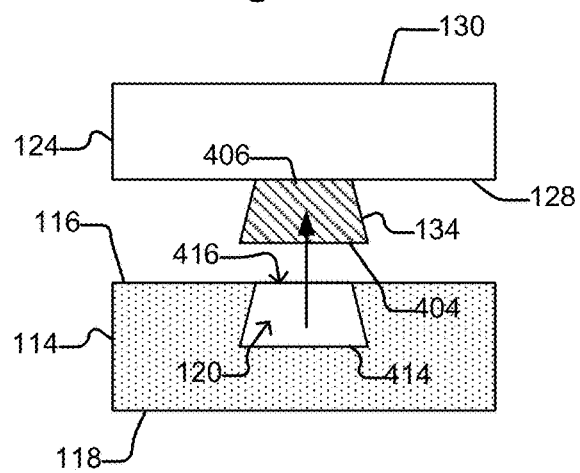
FIG. 3 illustrates an example of a pair of physically interlocking structures according to some embodiments of the invention.

As shown in FIG. 3, the protrusion 134 can be wider at a first end 404 than at a second end 406. For example, the first (wider) end 404 can be the end of the protrusion 134 that is farthest from the first side 128 of the wiring substrate 124, and the second end 406 can be the end that is nearest the first side 128. The corresponding receptacle 120 can have a similar though complementary shape. As shown, an inner end 414 of the receptacle 120 can be wider than the opening 416 of the receptacle 120. When press fit together and interlocked, the protrusion 134 and receptacle 120, shaped as shown in FIG. 3, can provide both vertical and horizontal stability to the mass of material 114 to prevent the mass of material 114 from decoupling from the wiring substrate 124.

Regardless of the shape of the protrusions 134, the terminals 132 and the protrusions 134 can comprise substantially the same material. For example, the protrusions 134 and the terminals 132 can comprise a conductive material (e.g., a metal). The use of the same material can facilitate manufacturing the terminals 132 and protrusions 134, since both structures can then be formed in the same process(es). Alternatively, the terminals 132 and the protrusions 134 can be formed in separate processes. When formed in the same processes, the protrusions 134 and terminals 132 can have the same heights. Alternatively, the protrusions 134 and terminals 132 can have different heights as shown in FIGS. 1A and 1B.

The contactor 101 illustrated in FIGS. 1A and 1B can be part of an electronic device in which the probes 108 comprising the columns 104 can make electrical connections with another device. For example, the contactor 101 can be part of an electronic test socket (not shown) for contacting and testing electronic devices such as semiconductor dies, or the like. As another example, the contactor 101 can be part of single or double sided wiring structures composed of silicon, glass, epoxy, or polyimide with embedded wiring of an electrically conductive material such as copper, gold, or the like.

FIG. 5 illustrates yet another example of an electronic device (a probe card assembly 100) of which the contactor 101 of FIGS. 1A and 1B can a part. As shown in FIG. 5, the contactor 101 can be part of a probe card assembly 100 such as can be used to contact and test an electronic device under test ("DUT") 550, which can be any type of electronic device to be tested. Examples of DUT 550 include the semiconductor dies of an unsingulated semiconductor wafer, one or more singulated semiconductor dies, and the like. It is noted that FIG. 5 is not necessarily to scale. For example, the contactor 101 is enlarged to better illustrate details of the contactor 101.

As shown, the probe card assembly 100 of FIG. 5 can comprise an electrical interface 142, an interface substrate 138, an electrical connector 140, a base 126, and the contactor 101 of FIGS. 1A and 1B. Fasteners (not shown)

such as screws, bolts, brackets, or the like can couple the foregoing elements of the probe card assembly 100 together. The electrical interface 142 can be configured to connect electrically to channels (e.g., electrical channels for test signals, control signals, power, or the like) to and from a tester (not shown) for controlling testing of DUT 550, and the interface substrate 138, connector 140, and base 126 can provide electrical paths 502 form the interface 142 to the electrical connections 136 of the contactor 101 and thus to the probes 108, which can be in contact with terminals 552 of the DUT 550. The DUT 550 can be a semiconductor wafer, a semiconductor die, an interposer, or other electronic device to be tested.

The electrical interface 142 can comprise any electrical connection device suitable for connecting to the channels (not shown) to the tester (not shown). For example, the electrical interface 142 can comprise a zero-insertion-force (ZIF) electrical connector, pogo pin pads, or other the like. The interface substrate 138 can be a wiring board such as a printed circuit board, a layered ceramic block, or the like. The base 126 can also be a wiring board such as a printed circuit board, a layer ceramic block, or the like, and the electrical connector 140 can be an interposer or other type of electrical connector for electrically connecting the interface board 138 to the base 126. As another example, the electrical connector 140 can comprise (e.g., consist essentially of) solder bumps (not shown) that electrically connect the interface substrate 138 to the base 126. As yet another example, the electrical connector 140 can comprise electrically conductive spring interconnection structures. As shown, the interface substrate 138, connector 140, and base 126 can comprise internal and/or external electrical traces, vias, wiring, or the like that form individual electrical paths 502 from the interface 142 to the electrical connections 136 of the wiring substrate 124 and thus to the terminals 132 and the probes 108. The probe card assembly 100 thus provides individual electrical paths comprising the paths 502 through the interface substrate 138, connector 140, and base 126 to the electrical connections 136 of the wiring substrate 124 and thus to the terminals 132 and probes 108.

As mentioned, in some embodiments, the electrical connections 136 can comprise electrically conductive traces (not shown) on a surface of the wiring substrate 124 that are connected one or more of the terminals 132, and the electrical connections 136 can further comprise electrically conductive wires (not shown) bonded from those traces (not shown) around the wiring substrate 124 to the portions of the electrical paths 502 in and/or on the base 126. Alternatively, the electrical connections 136 can comprise electrically conductive vias through the wiring substrate 124 to the portions of the electrical paths 502 of the base 126. As noted above, the portion of the electrical paths 502 through the electrical connector 140 can comprise solder bumps (not shown), and indeed, in some embodiments, the electrical connector 140 can consist essentially of such solder bumps (not shown).

Reference will now be made to FIG. 6, which illustrates an example of a process 600 for making a contactor like the contactor 101 of FIGS. 1A and 1B and incorporated the contactor into an electronic device.

At step 602, a growth substrate is provided. The growth substrate can be used to both grow a carbon nanotube column (e.g., column 104 of FIGS. 1A-1B) and serve as a template for a probe film (e.g., film 102 of FIGS. 1A and 1B). At step 604, carbon nanotube columns are grown on the growth substrate. As noted below, the carbon nanotube columns can be treated, for example, to enhance electrical conductivity. Next, at step 606 a mass of material is deposited on the growth substrate around the carbon nanotube columns and cured as needed. The mass of material and the probes form a probe film (e.g., film 102 of FIGS. 1A-1B). At step 608, the probe film is removed from the growth substrate. At step 610, the probe film is coupled to a wiring substrate (e.g., wiring substrate 124 of FIGS. 1A and 1B) to form a contactor (e.g. like contactor 101). At step 612, the wiring substrate can be incorporated into an electronic device (e.g., the probe card assembly of FIG. 5).

Having provided an overview of the process 600 of FIG. 6, examples of the process 600 will now be discussed with respect FIGS. 7A-10B. FIGS. 7A-7E illustrate an example of the steps 602-608 of the process 600 in which the probe film 102 having the receptacles 120 is made. FIGS. 8A-8C illustrate an example of a process of making a probe film 800, which can be similar to the probe film 102 except that probe film 800 has protrusions 804, which can be like protrusions 134, rather than receptacles 120. FIGS. 9A-10B illustrate examples of the step 610 of the process 600.

Figure 7A:
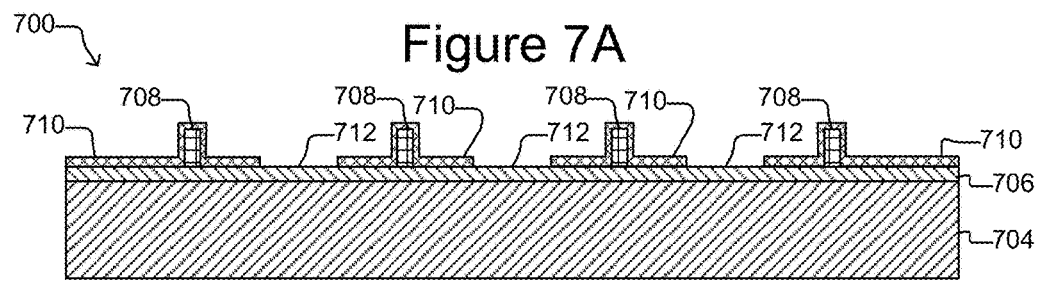
FIG. 7A illustrates an example of a growth substrate according to some embodiments of the invention.
Figure 8A:
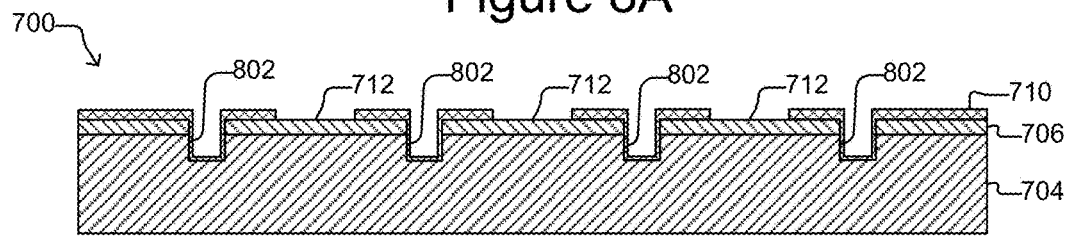
FIG. 8A illustrates another example of a growth substrate according to some embodiments of the invention.
Figure 8B:
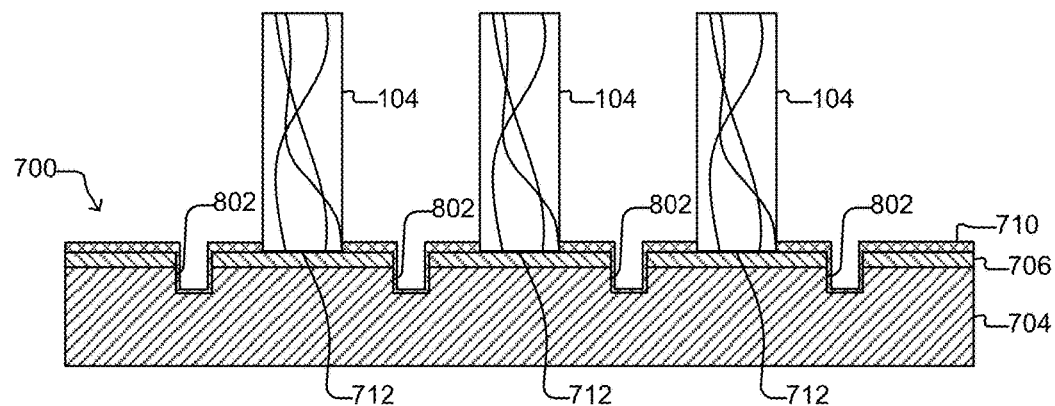
FIG. 8B illustrates an example of the growth substrate of FIG. 8A having carbon nanotube columns according to some embodiments of the invention.
Figure 8C:
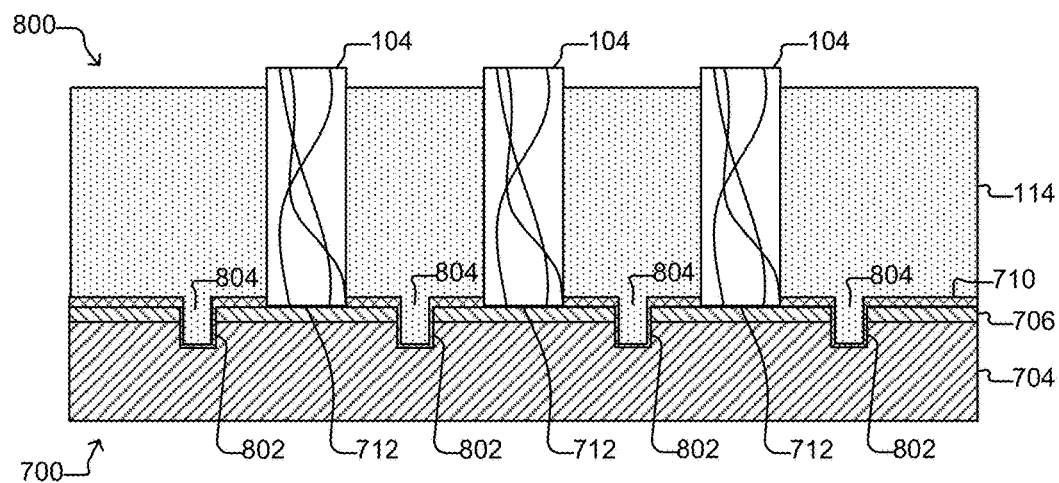
FIG. 8C illustrates an example of the growth substrate and carbon nanotube columns of FIG. 8B and a deposited mass of material on the growth substrate according to some embodiments of the invention.

FIG. 7A illustrates an example of step 602 of the process 600 of FIG. 6. In FIG. 7A, a growth substrate 700 is provided. As shown in FIG. 7A, the growth substrate 700 can include one or more layers, such as a substrate layer 704 and a growth layer 706. For example, the substrate layer 704 can be a glass, ceramic, semiconductor (e.g., silicon), or other suitable layer. The growth layer 706 can comprise a material on which the carbon nanotube columns 104 can be grown. For example, the growth layer 706 can comprise an oxide film or the like disposed on the substrate layer 704. In another example, the growth substrate 700 can include only a single layer, such as the substrate layer 704. In still another example, the growth substrate 700 can include more than two layers.

As shown, the growth substrate 700 can be masked with a mask layer 710, which leaves portions of the growth layer 706 (referred to herein as pads 712) exposed. The mask layer 710 can comprise a metal layer (e.g., gold, silver, aluminum, or the like), a photoresist material, or the like. The columns 104 can then be grown on the pads 712.

The pattern for growing columns 104 is the pattern of the pads 712. For example, columns 104 can be grown on growth substrate 700 in a pattern that corresponds to a pattern of terminals 132 to which the columns 104 will be transferred. For example, the pattern of the columns 104 can correspond to terminals 132 of a wiring substrate 124 (as shown in FIGS. 1A and 1B). Moreover, that pattern can correspond to terminals of an electronic device that probes 108 comprising the columns 104 will be used to contact. An example is provided in FIG. 13 in which the probes 108 can correspond to the terminals 1308 of a DUT 1306.

As shown, a plurality of extensions 708 (which are examples of mold features) can be disposed on the top surface of the growth substrate 700. The extensions 708 can be located on the growth substrate 700 in a pattern that will form receptacles 120 (shown in FIG. 7D) (upon removal of the film 102) in a resulting film 102, as shown in FIG. 7C-7D. For example, extensions 708 can be placed in a pattern that results in a film 102 having receptacles 120 that correspond to protrusions 134 in a wiring substrate 124 as shown in FIGS. 1A and 1B and discussed above. In some embodiments, such patterns situate extensions 708 in various two-dimensional or three-dimensional patterns on the growth substrate 700 to provide interlocking structures about the columns 104. For example, such patterns can include positioning a single feature 708 between adjacent pads 712, as shown. In another example, such patterns can position multiple extensions 708 between adjacent pads 712. In another example, extensions 708 may be evenly dispersed in a two-dimensional or three-dimensional pattern on the growth substrate 700.

Figure 7B:
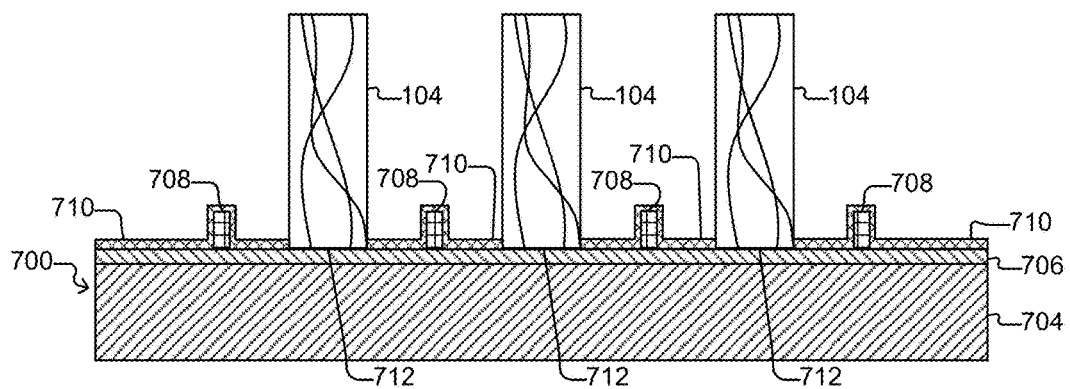
FIG. 7B illustrates an example of the growth substrate of FIG. 7A having carbon nanotube columns according to some embodiments of the invention.

FIG. 7B illustrates an example of step 604 of the process 600 of FIG. 6. In FIG. 7B, carbon nanotube columns 104 are grown on the growth substrate 700. As shown, columns 104 can be grown to a height that substantially exceeds the height of extensions 708 on the growth substrate 700. Carbon nanotube columns 104 can be grown on the exposed pads 712. Such carbon nanotube growth can be in accordance with growth processes such as the floating catalyst or fixed catalyst processes described in U.S. Pat. No. 8,130,007 (issued Mar. 6, 2012), growth processes described in US Patent Application Publication No. 2010/0083489 (filed Dec. 7, 2009), or the like. U.S. Pat. No. 8,130,007 and US Patent Application Publication No. 2010/0083489 are incorporated herein by reference in their entirety.

Various treatments or processes can be performed on the carbon nanotube columns 104. For example, electrically conductive material (not shown) can be deposited on and/or into the carbon nanotube columns 104. As another example, epoxy can be wicked into the columns 104.

FIG. 7C illustrates an example of step 606 of the process 600 of FIG. 6. In FIG. 7C, a mass of material 114 is deposited on the growth substrate 700 to from a probe film 102. The mass of material 114 can be deposited on the growth substrate 700 about the columns 104. As mentioned, portions of the mass of material 114 can flow or infuse into the columns 104 and thus impregnate the columns 104. Depending on the nature of the mass of material 114, after being deposited on the growth substrate 700, the mass of material 114 can be cured (e.g., hardened). Prior to curing, the mass of material 114 can be formed around or within the various features and geometries of the mask layer 708. As such, portions of the mass of material 114 can flow around extensions 708 to form receptacles 120 (shown in FIG. 7D). In some embodiments, a supporting structure (not shown) can be provided about the sides of the mass of material 114 until it is cured, to assist to shape the mass of material 114. Such a supporting structure (not shown) can be removed after curing.

FIG. 7D is an example of step 608 of the process 600 of FIG. 6. FIG. 7D illustrates the mass of material 114 with the embedded carbon nanotube columns 104 being removed from the growth substrate 700. The material 114 can be removed from the growth substrate 700 by pulling the material 114 away from the growth substrate or by some other method. As shown, when removed from the growth substrate 700, the mass of material 114 can include receptacles 120 that correspond to the extensions 708 of the growth substrate 700. The material 114 with the embedded columns 114 removed from the growth substrate 700 is the film 102 of FIGS. 1A and 1B.

After making the probe film 102 in steps 602-608, the film 102 can be coupled to a wiring substrate 124 generally as shown in FIGS. 1A and 1B. For example, the probe film 102 can be brought together with the wiring substrate 124 such that the protrusions 134 extending from the wiring substrate 124 are inserted into and interlock with the receptacles 120 in the probe film 102 and the terminals 132 of the wiring substrate 124 contact (e.g., are pressed into) the columns 104 as discussed above. The foregoing is an example of step 610 of FIG. 6.

As mentioned above, the film 102 of FIGS. 1A and 1B can be configured to have protrusions rather than the receptacles 120. FIGS. 8A-8C illustrate an example of steps 602-608 of FIG. 6 for making a probe film 800, which can be the same as the probe film 102 except that the probe film 800 has protrusions 804 rather than receptacles 120.

FIG. 8A is an example of step 602 of the process 600 of FIG. 6. As shown in FIG. 8A, a growth substrate 700 comprising a substrate layer 704 and a growth layer 706 as described above with respect to FIG. 7A can be provided. So that the growth substrate 700 can serve as a template for a film 800 having protrusions 804, indentations 802 (which are examples of mold features) can be formed into the substrate layer 704 and/or at the growth layer 706 of the growth substrate 700. These indentations 802 can be shaped and sized and otherwise configured as templates for the protrusions 804 of the film 800. Such indentations 802 can be formed using a deep reactive ion etch (DRIE) process and/or other suitable process(es). As discussed above with respect to FIG. 7A, a mask layer 710 can define pads 712 on which the carbon nanotube columns 104 will be grown. FIG. 8B is an example of step 604 of process 600 of FIG. 6, in which columns 104 are grown on the growth pads 712 as discussed above with respect to FIG. 7B (which is an example of step 604 of process 600).

FIG. 8C is an example of step 606 of process 600 of FIG. 6. FIG. 8C illustrates a mass of material 114 deposited onto the growth substrate 700 generally as discussed above with respect to FIG. 7C except that the mass of material 114 can enter indentations 802 to form protrusions 804 in the mass of material 114. In this manner, after the mass of material 114 is cured, the film 800 can include a plurality of protrusions 804. Although not shown, the probe film 800 comprising the mass of material 114 with the embedded columns 104 can be removed from the growth substrate 700 generally as shown and discussed above with respect to FIG. 7D. The separated probe film 800 with embedded carbon nanotube columns 104 and protrusions 084 is thus an example of the probe film 102 of FIGS. 1A and 1B and can replace the probe film 102 in any embodiment or figure herein.

FIGS. 9A-9B illustrate an example of step 610 of the process 600 of FIG. 6, in which the film 800 is coupled to the wiring substrate 124 in which the wiring substrate 124 has receptacles 904 rather than protrusions 134. As shown, the plurality of protrusions 804 of the film 800 can physically interlock with a plurality of corresponding receptacles 904 in the wiring substrate 124. As noted above with respect to FIGS. 1A and 1B, the wiring substrate 124 can have receptacles (e.g., like receptacles 120) rather than the protrusions 134. The receptacles 904 are examples of such receptacles.

As shown in FIGS. 9A and 9B, a protrusion 804 of film 800 can interlock within a corresponding receptacle 904 formed on the wiring substrate 124. As shown, the receptacle 904 can comprise the space between two or more rods 902 that extend from the first side 128 of the wiring substrate 124. The rods 902 can be coupled to the first side 128 of the wiring substrate 124. In some embodiments, the rods 902 can be formed of the same material as the terminals 132. The use of the same material can facilitate manufacturing of the wiring substrate 124 by permitting both the rods 902 and the terminals 132 to be manufactured during the same processes. Alternatively, the rods 902 and the terminals 132 can be formed using different materials and/or in different processes.

FIG. 9C shows a perspective view and FIG. 9D shows a top view of a protrusion 804 of the film 800 within a set of rods 902 of the wiring substrate 124. As shown, rods 902 (three are shown but there can be more of fewer) can form a receptacle 904 into which the protrusion 804 is inserted and interlocked. The rods 902 can be shaped and sized and positioned to apply at least a slight inward pressure on the protrusion 804 to form a press fit connection between the rods 902 and the protrusion 804. This interlocking of two or more protrusions 804 and the receptacles 904 (e.g., as configured in any of FIGS. 9C-9H) can couple the film 800 to the wiring substrate 124, as shown in FIG. 9B. (Each interlocked pair of a protrusion 804 and a receptacle 904 can be an example of an interlocking structure 144 as illustrated in FIG. 1B.)

The receptacle 904 can be formed using various number of rods 902 and have various rod shapes and configuration. As shown, the rods 902 can have a circular cross-section. The rods 902 can also have other shaped cross-sections, including square, rectangular, triangular, or the like. As further shown, three rods 902 can form the receptacle 904. In other configurations, four, five, six, seven, or more rods 902 can form the receptacle 904. Moreover, in some embodiments, a single, tubular rod 902 can be formed having an inner receptacle 904 formed therein.

FIG. 9E illustrates another example of the receptacle 904, which can comprise a plurality of walls 922 that extend from the surface of the wiring substrate 124. The walls 904 can define a space into which the protrusion 804 can be press fit. FIG. 9F (which is a top view) illustrates yet another example of the receptacle 904 in which sidewalls 932 (which can be similar to the sidewalls 922 of FIG. 9E) are arranged to form a space into which the protrusion 804 can be press fit as shown.

FIGS. 9G and 9H (which show top, perspective view) illustrate additional examples of the receptacle 904. In FIG. 9G, a square or rectangular shaped enclosure defines an interior space into which the protrusion 804 can be press fit. In FIG. 9H, an octagon shaped enclosure defines an interior space into which the protrusion 804 can be press fit. The enclosure in FIG. 9H could alternatively be a hexagon, pentagon, or the like.

Figure 9I:
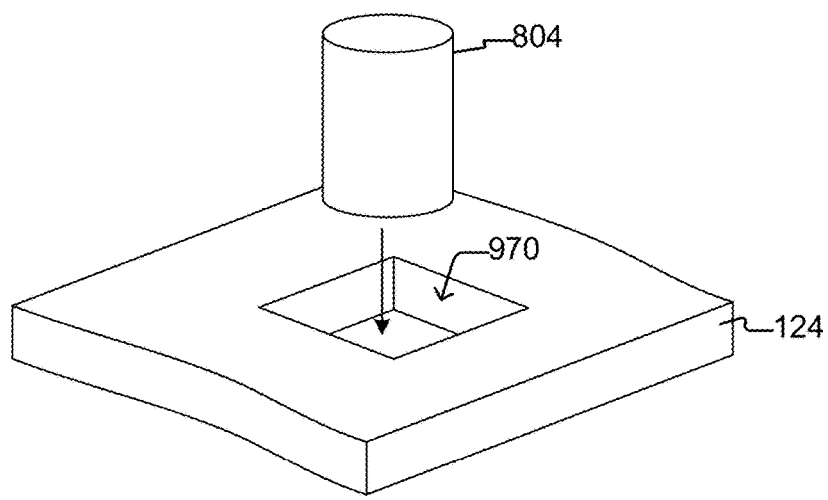
FIG. 9I illustrates a perspective partial view of a wiring substrate with a receptacle comprising a square or rectangular hole in the wiring substrate 124 according to some embodiments of the invention.
Figure 9J:
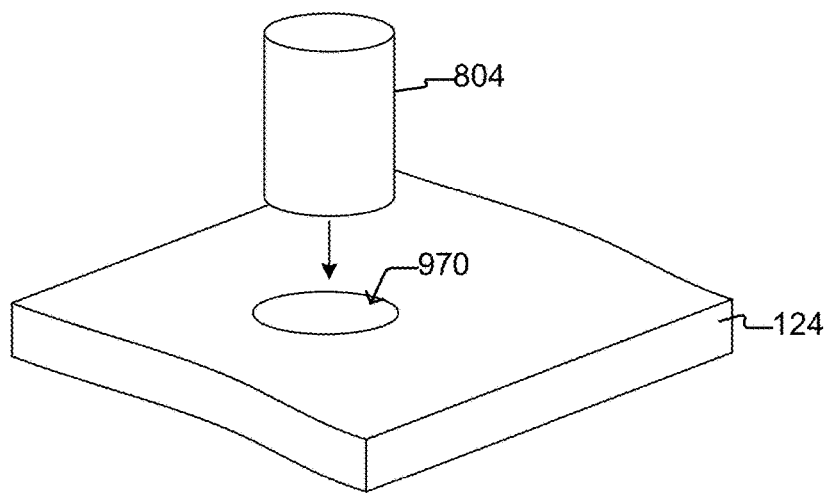
FIG. 9J illustrates a perspective partial view of a wiring substrate with a receptacle comprising a circular hole in the wiring substrate 124 according to some embodiments of the invention.
Figure 9K:
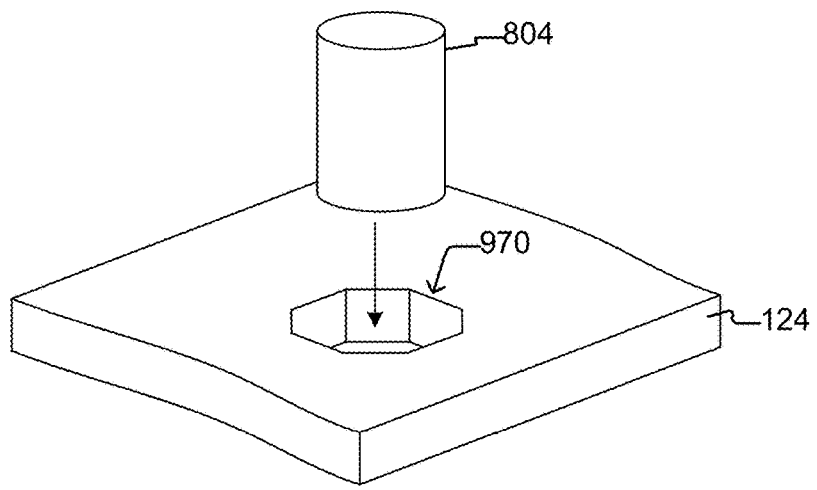
FIG. 9K illustrates a perspective partial view of a wiring substrate with a receptacle comprising an octagon shaped hole in the wiring substrate 124 according to some embodiments of the invention.
Figure 9L:
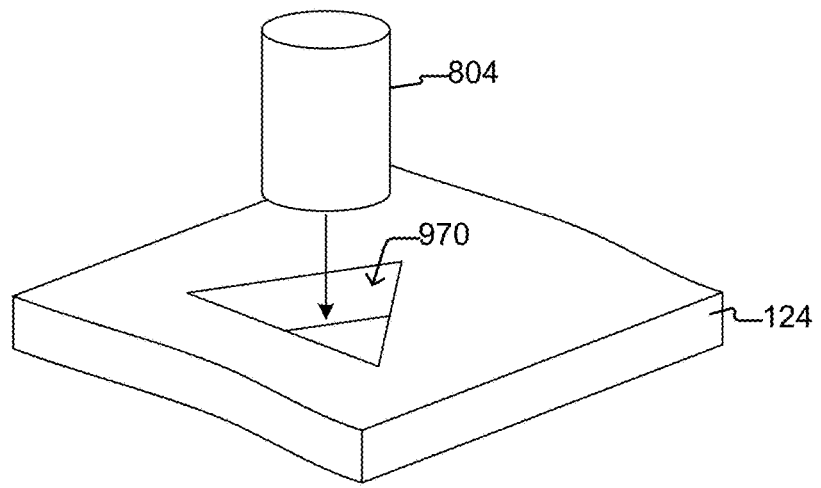
FIG. 9L illustrates a perspective partial view of a wiring substrate with a receptacle comprising a triangular hole into the wiring substrate 124 according to some embodiments of the invention.

FIGS. 9I-L illustrate an example in which the receptacle 120 of the Figures is alternatively configured as a hole or opening in the wiring 124. Alternatively, any of the illustrated receptacles 120 could alternatively be in the probe film 120 (or 800). FIG. 9I shows a receptacle 970 in the shape of a square or rectangle. FIG. 9J shows a receptacle 970 in the shape of a circle. FIG. 9K shows a receptacle 970 in the shape of an octagon, which can alternatively by a hexagon, pentagon, or the like. FIG. 9L shows a receptacle 970 in the shape of a triangle. The foregoing are all examples of the receptacle 120.

The probe film 800 with protrusions 804 interlocked with the receptacles 904 of the wiring substrate 124, as shown in FIG. 9B (including any configuration of the protrusion 904 illustrated in FIGS. 9C-9H), is another example of the contactor 101 of FIGS. 1A and 1B, and interlocked protrusions 804 and receptacles 904 are examples of the interlocking structures 144 of FIGS. 1A and 1B.

Figure 10A:
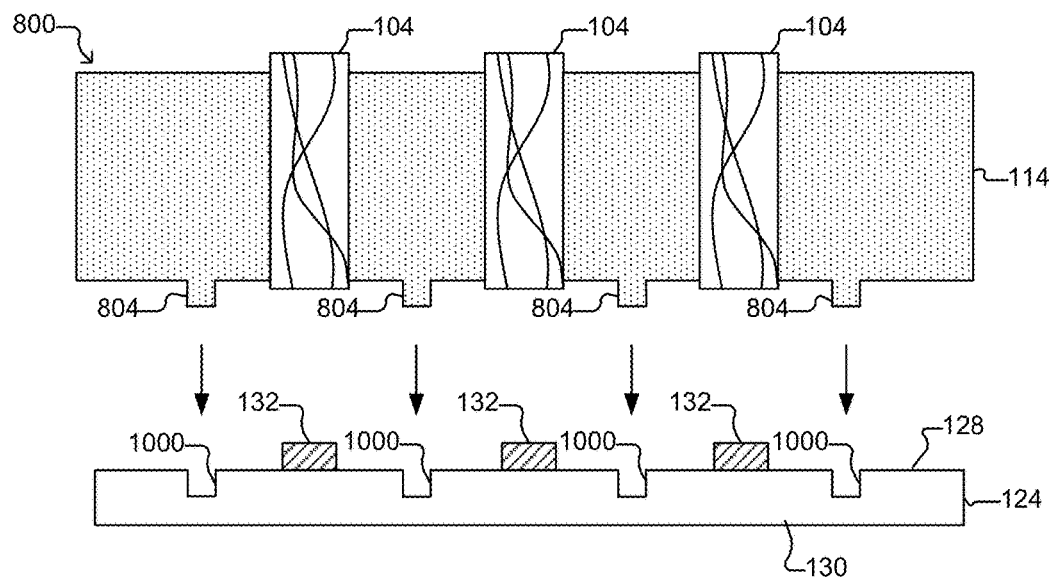
FIG. 10A illustrates another film and wiring substrate according to some embodiments of the invention.
Figure 10B:
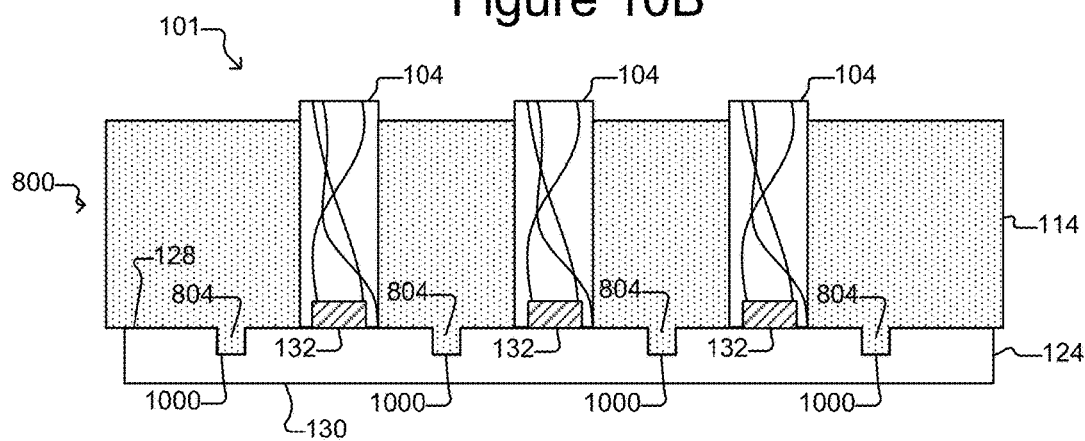
FIG. 10B illustrates the film and wiring substrate of FIG. 10A assembled according to some embodiments of the invention.

FIGS. 10A-10B illustrate another example of step 610 of the process 600 of FIG. 6, in which the film 800 is coupled to the wiring substrate 124. As shown, the wiring substrate 124 can include receptacles 1000 formed in the first side of the wiring substrate 124 rather than the protrusions 134 shown in FIGS. 1A and 1B or the receptacles 904 shown in FIGS. 9A-9C. Otherwise the wiring substrate 124 can be as shown in FIGS. 9A and 9B except that the receptacles 1000 replace the receptacles 904.

FIG. 10B illustrates the film 800 coupled to the wiring substrate 124. As shown, when coupled the protrusions 804 of the film 800 can be inserted into the receptacles 1000 of the wiring substrate 124. As mentioned, the protrusions 804 and receptacles 1000 can form a pair of physically interlocked structures. The probe film 800 with protrusions 804 interlocked with the receptacles 904 of the wiring substrate 124, as shown in FIG. 9B, is another example of the contactor 101 of FIGS. 1A and 1B.

Referring again to the process 600 of FIG. 6, at step 612, the probe contact 101 (comprising the probe film 102 coupled to the wiring substrate 124 as shown in FIG. 1B, the probe film 800 coupled to the wiring substrate 124 as shown in FIG. 9B, or the probe film 800 coupled to the wiring substrate 124 as shown in FIG. 10B) can be incorporated into an electronic device such as the probe card assembly 100 of FIG. 5.

Examples of a contactor 101 comprising carbon nanotube columns 104 embedded in a flexible mass of material 114 have been described, and an example application of such a contactor 101 in a probe card assembly 100 has also been described. Examples of processes of making the contactor 101 and incorporating the contactor 101 into an electronic device have also been described. The foregoing descriptions are examples only, and variations are contemplated. For example, as illustrated by the probe film 800 of FIGS. 8A-8C, the probe film 800 can comprise protrusions 804 rather than receptacles 120. Otherwise, the probe film 800 can be like the probe film 102 and can replace any instance of the probe film 102 in any of the figures. As another example, as illustrated in FIGS. 9A-10B, the wiring substrate 124 can have receptacles 904 or 1000 rather than protrusions 132. Otherwise, the wiring substrates 124 of FIGS. 9A-10B can be like the wiring substrates 124 in any other figure, and the wiring substrate 124 in any figure can be configured with the receptacles 904 or 1000.

Figure 11:
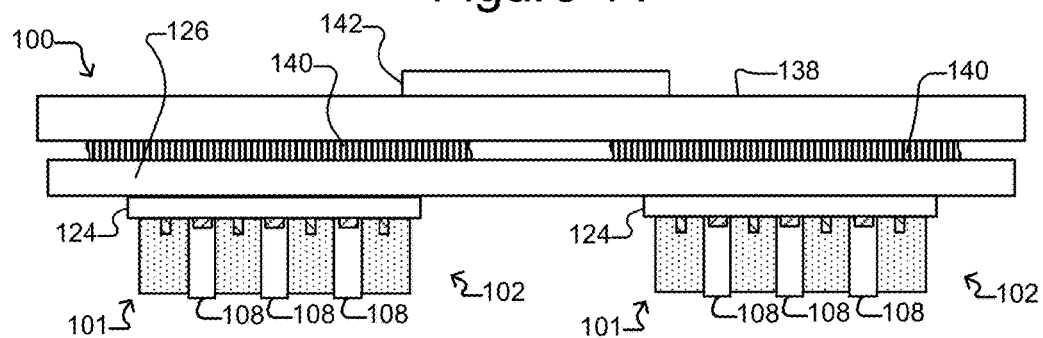
FIG. 11 illustrates an example of a variation of the probe card assembly of FIG. 5 according to some embodiments of the invention.
Figure 12:
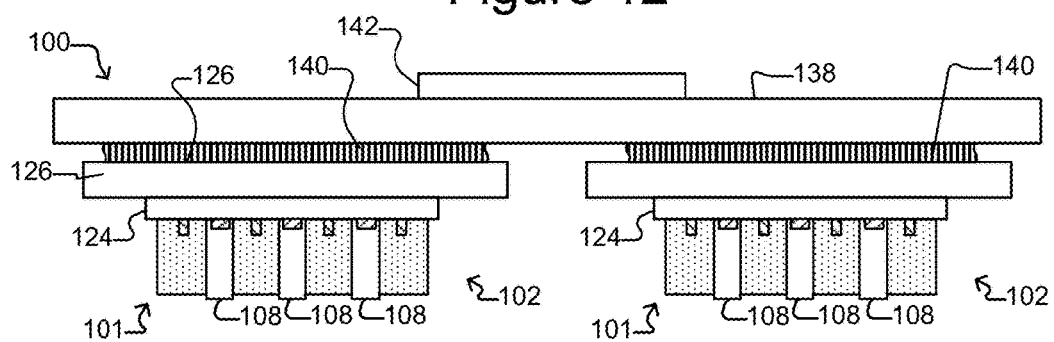
FIG. 12 illustrates another example of a variation of the probe card assembly of FIG. 5 according to some embodiments of the invention.

As another example, the probe card assembly 100 of FIG. 5 is an example, and other configurations are contemplated. For example, the probe card assembly 100 of FIG. 5 need not include the base 126, in which case the wiring substrate 124 can be connected directly to the connector 140. Similarly, the probe card assembly 100 need not include the connector 140, and the base 126 can be connected directly to the interface substrate 138. As yet another example, absent the base 126 and the connector 140, the wiring substrate 124 can be connected directly to the interface substrate 138. FIGS. 11 and 12 illustrate additional examples of variations of the probe card assembly 100.

FIG. 11 illustrates an example of the probe card assembly 100 with a plurality of contactors 101 (two are shown but there can be more) coupled to one base 126. FIG. 12 illustrates another example of the probe card assembly 100 in which a plurality of contactors 101 (two are shown but there can be more) are coupled to a plurality of bases 126 (two are shown but there can be more). Although not shown in FIGS. 11 and 12, the interface substrate 138, each electrical connector 140, each base 124 can comprise the electrical paths 502 illustrated in FIG. 5 in any configuration described above, and each wiring substrate 124 can comprise the electrical connections 136 illustrated in FIG. 5 in any configuration described above. (The illustrations in FIGS. 11 and 12 are not necessarily to scale; for example, contactors 101 are enlarged to better illustrate detail.)

Figure 13:
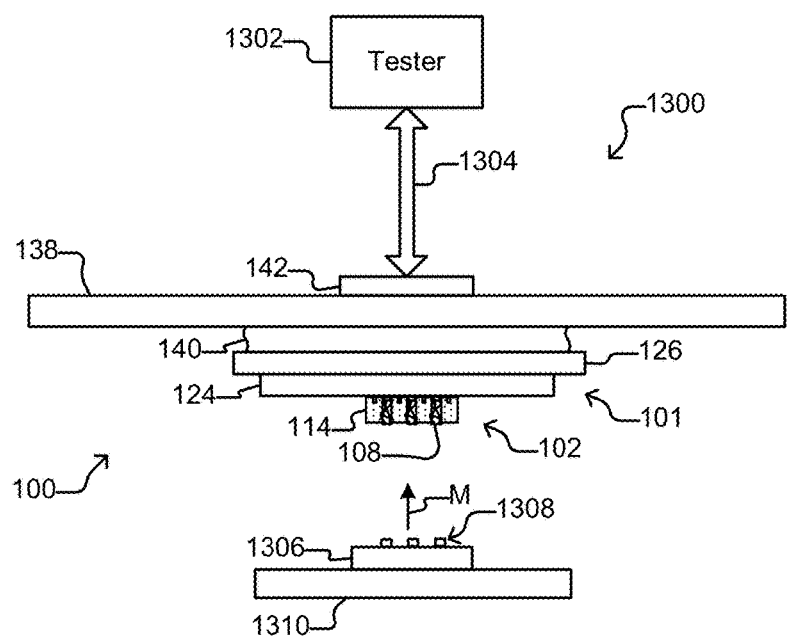
FIG. 13 illustrates an example of a test system according to some embodiments of the invention.

Regardless of how the probe card assembly 100 is configured, the probe card assembly 100 can be used in a test system for contacting and testing electronic devices. FIG. 13 illustrates an example of a test system 1300 for testing an electronic device 1306 (hereinafter referred to as a "device under test" or "DUT"). DUT 1306 can be an electronic device comprising electrical terminals 1308 for providing signals, data, power, or the like into or out of the DUT 1306. For example, the DUT 1306 can be one or more semiconductor dies (singulated or unsingulated, packaged or unpackaged), electronic components, circuit boards, or the like).

The probe card assembly 100 can be mounted to a housing (not shown) such as a prober (not shown) in which the DUT 1306 is disposed on a moveable stage 1310. The DUT 1306 can be tested by bringing terminals 1308 of the DUT 1306 and probes 108 of the probe card assembly 100 into contact and thereby forming electrical connections between the probes 108 and the terminals 1308. This can be accomplished by moving the stage 1310 and/or the probe card assembly 100.

The tester 1302 (which can be a computer, computer system, or the like configured to control testing of the DUT 1306) can then provide power, test signals, control signals, and/or the like through channels 1304 (e.g., cables, wires, wireless communications channels, or the like) and the probe card assembly 100 to the DUT 1306. The tester 1302 can similarly sense through the probe card assembly 100 and the channels 1304 response signals generated by the DUT 1306. The tester 1302 can then analyze the response signals to determine whether all or part of the DUT 1306 responded properly to the test signals and, consequently, whether all or part of the DUT 1306 passed or failed the testing. The tester 1302 can alternatively or in addition perform tasks other than testing the DUT 1306. For example, the tester 1302 can operate the DUT 1306, for example, to burn in the DUT 1306.

The test system 1300 illustrated in FIG. 13 is an example only, and variations are contemplated. For example, some or all of the tester 1302 can be disposed on the probe card assembly 100 (e.g., on the interface substrate 138 or the base 126).

Figure 14A:
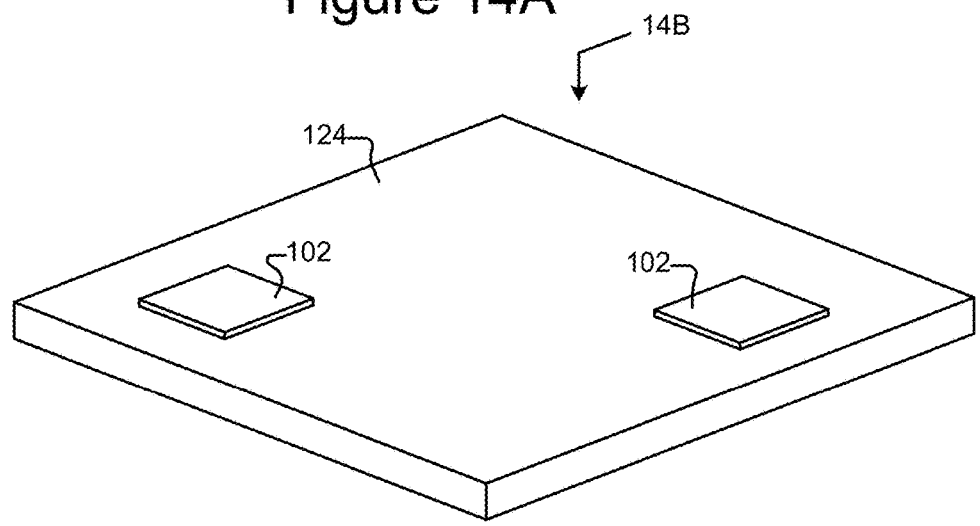
FIG. 14A is a perspective view of a wiring substrate to which are coupled a plurality of probe films according to some embodiments of the invention.
Figure 14B:
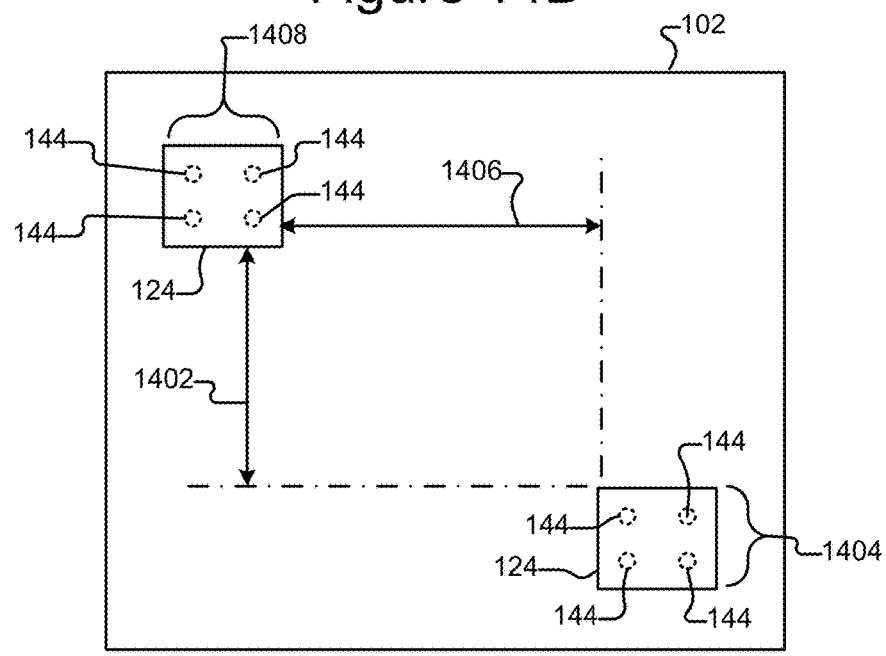
FIG. 14B is a top view of FIG. 14A.

The use of interlocking structures 144 (e.g., protrusions 134 to receptacles 120 or protrusions 804 to receptacles 904) to couple probe films 102 to a wiring substrate 124 can have a variety of advantages. (Although probe films 102 are illustrated in FIGS. 14A and 14B, probe films can be probe films 800 instead.) For example, as shown in FIGS. 14A and 14B, multiple probe films 102 (two are shown but there can be more) can be disposed on a wiring substrate 124, and in some embodiments, the probe films 102 can be widely spaced apart. For example, the distance 1402 in a first direction between probe films 102 can be one, two, three, four, five, or more times a width 1404 of a probe film 102, and/or the distance 1406 in a second (e.g., orthogonal) direction between the probe films 102 can be one, two, three, four, five, or more times a length 1408 of a probe film 102 as illustrated in FIG. 14B.

Moreover, the probe films 102 can be precisely positioned on the wiring substrate 124. Because the receptacle and/or the protrusion of each interlocking structure 144 that couples a probe film 102 to the wiring substrate 124 can be formed using precise lithographic processes (e.g., as discussed above), the receptacles and/or protrusions can be precisely positioned on the wiring substrate 124 and/or the probe films 102. Each probe film 102 can thus be precisely positioned on the wiring substrate 124 by merely press fitting the protrusions on the probe film 102 or wiring substrate 124 into the corresponding receptacles on the other of the probe film 102 or wiring substrate 124. As the protrusions of the interlocking structures 144 are pressed into the receptacles, the protrusions and receptacles align. For example, the elastic averaging nature of the interlocking structures 144 (the one of the receptacle or the protrusion on the elastic material 114 of the probe film 102 (see, e.g., FIG. 1B) is elastic) naturally align the probe film 102 in a precise position on the wiring substrate 124. This elastic averaging can also maintain each probe film 102 in the precision position even as the wiring substrate 124 and/or the probe film 102 expands or contracts due to thermal changes or other forces during normal operation of a device of which the wiring substrate 124 and probe films 102 are a part.

Figure 15A:
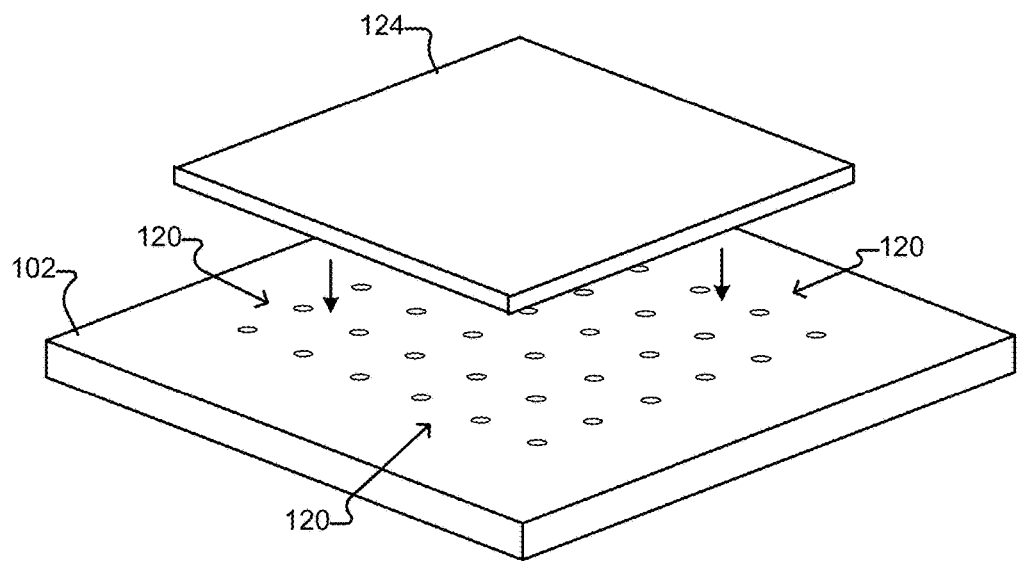
FIG. 15A is a top, perspective view of a wiring substrate comprising a plurality of receptacles to which a large probe film comprising protrusions can be coupled according to some embodiments of the invention.
Figure 15B:
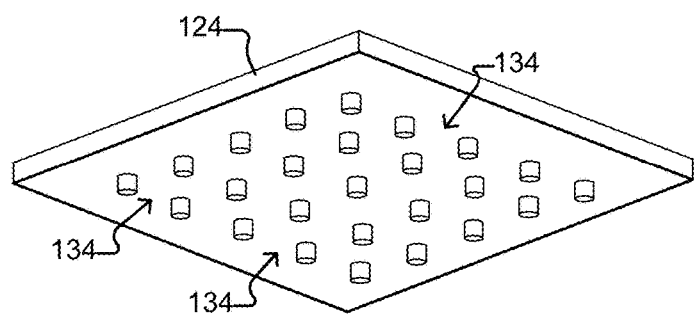
FIG. 15B shows a bottom, perspective view of the large probe film of FIG. 15B.

FIGS. 15A and 15B illustrate an example in which the wiring substrate 102 comprises many precisely positioned receptacles 120. As shown, a relatively large probe film 124 can be coupled to the wiring substrate 102 by coupling precisely positioned protrusions 134 (visible in FIG. 15B but not in FIG. 15A) on the probe film 124 to some or all of the receptacles 120. Alternatively, the receptacles 120 can be on the probe film 124 and the protrusions 134 can be on the wiring substrate 102. Regardless, as noted one or the other of the receptacles 120 or the protrusions 134 can be made of an elastic material. The coupling of such receptacles 120 and protrusions 134 (e.g., as shown in FIG. 1B) can elastically average to precisely position the probe film 124 on the wiring substrate 102.

As noted above, the wiring substrate 124 and probe films 102 can be used, for example, in a probe card assembly to contact terminals of a DUT to test the DUT. As another example of a test application, double sided contactors (not shown) comprising probe films 102 coupled to opposite surfaces of the wiring substrate 102 can be used to test silicon interposers.

Although specific embodiments and applications of the invention have been described in this specification, these embodiments and applications are exemplary only, and many variations are possible.

We claim:

1. A probe card assembly comprising:
an electrical interface to a tester that controls testing of a device under test;
a mass of flexible, resilient electrically insulating material;
electrically conductive columns of intertwined carbon nanotubes surrounded by said mass of material, each said column extending from a first side of said mass of material to a second side of said mass of material, wherein said second side is opposite said first side;
a wiring substrate comprising electrically conductive terminals extending from a first side of said wiring substrate into said columns, wherein said terminals are electrically connected to said interface; and
pairs of physically interlocked structures coupling said flexible mass of material to said wiring substrate, wherein:
a first one of said interlocked structures in each said pair is a receptacle,
a second one of said interlocked structures in each said pair is a protrusion inserted into and physically interlocked with said receptacle to form a press fit with said receptacle,
said mass of material comprises one of said receptacle or said protrusion of each said pair, and
said wiring substrate comprises the other of said receptacle or said protrusion of each said pair;
wherein ones of said terminals of said wiring substrate contact and are thereby electrically connected to corresponding ones of said carbon nanotube columns;
wherein said ones of said terminals extend into and are thereby at least partially embedded in said corresponding ones of said carbon nanotube columns.

2. The probe card assembly of claim 1, wherein each said receptacle comprises a space between a group of rods extending from said first side of said wiring substrate or said first side of said mass of material.

3. The probe card assembly of claim 1, wherein each said receptacle is into a surface of said first side of said wiring substrate or a surface of said first side of said mass of material.

4. The probe card assembly of claim 1 wherein:
said protrusions extend from said first side of said wiring substrate, and
said protrusions consist of substantially a same material as said terminals.

5. The probe card assembly of claim 1, wherein said protrusion of each said pair:
has a conical shape in which a first end of said protrusion is wider than a second end of said protrusion, and
extends from said first side of said wiring substrate from said second end to said first end.

6. The probe card assembly of claim 5, wherein said receptacle of each said pair:
has a conical shape in which an inner end of said receptacle is wider than an opening of said receptacle, and
extends into said first side of said mass of material from said opening to said inner end.

7. The probe card assembly of claim 1, further comprising an adhesive disposed between said first side of said wiring substrate and said first side of said mass of material, wherein said adhesive adheres said first side of said mass of material to said first side of said wiring substrate.

8. The probe card assembly of claim 1, wherein said mass of material is a silicone-based elastomer.

9. The probe card assembly of claim 1, said carbon nanotube columns are disposed in a pattern in said mass of material that corresponds to terminals of an electronic device to be contacted and tested.

10. The probe card assembly of claim 9, wherein each said carbon nanotube column is a probe for contacting one of said terminals of said electronic device to be contacted and tested.

11. The probe card assembly of claim 10 further comprising electrical paths from said interface to said carbon nanotube columns.

12. An electronic device comprising:
a probe film comprising a mass of flexible, resilient electrically insulating material and electrically conductive columns of intertwined carbon nanotubes embedded in said mass of material;
a wiring substrate comprising electrically conductive terminals extending from a first side of said wiring substrate into said columns; and
pairs of physically interlocked structures coupling said flexible mass of material to said wiring substrate, wherein:
a first one of said interlocked structures in each said pair is a receptacle, and
a second one of said interlocked structures in each said pair is a protrusion inserted into and physically interlocked with said receptacle to form a press fit with said receptacle;
said mass of material comprises one of said receptacle or said protrusion of each said pair, and
said wiring substrate comprises the other of said receptacle or said protrusion of each said pair;
wherein ones of said terminals of said wiring substrate contact and are thereby electrically connected to corresponding ones of said carbon nanotube columns;
wherein said ones of said terminals extend into and are thereby at least partially embedded in said corresponding ones of said carbon nanotube columns.

13. The electronic device of claim 12, wherein at least one of said receptacles or said protrusions comprises an elastic material, and said interlocking of said receptacles and said protrusions precisely positions said probe film with respect to said wiring substrate by elastic averaging.

14. The electronic device of claim 12, wherein each said receptacle comprises a space between a group of rods extending from said first side of said wiring substrate or a first side of said mass of material.

15. The electronic device of claim 12, wherein each said receptacle is into a surface of said first side of said wiring substrate or a surface of a first side of said mass of material.

16. The electronic device of claim 12, wherein said protrusion of each said pair:
has a conical shape in which a first end of said protrusion is wider than a second end of said protrusion, and
extends from said first side of said wiring substrate from said second end to said first end.

17. The electronic device of claim 16, wherein said receptacle of each said pair:
has a conical shape in which an inner end of said receptacle is wider than an opening of said receptacle, and
extends into a first side of said mass of material from said opening to said inner end.

18. The electronic device of claim 12, wherein said mass of material is a silicone-based elastomer.

* * * * *